United States Patent
Bernds et al.

(10) Patent No.: US 7,238,961 B2
(45) Date of Patent: Jul. 3, 2007

(54) ORGANIC FIELD EFFECT TRANSISTOR WITH A PHOTOSTRUCTURED GATE DIELECTRIC, METHOD FOR THE PRODUCTION AND USE THEREOF IN ORGANIC ELECTRONICS

(75) Inventors: Adolf Bernds, Baiersdorf (DE); Walter Fix, Furth (DE); Henning Rost, Erlangen (DE)

(73) Assignee: PolyIC GmbH & Co. KG, Furth (DE)

( * ) Notice: Subject to any disclaimer, the term of this patent is extended or adjusted under 35 U.S.C. 154(b) by 219 days.

(21) Appl. No.: 10/467,636

(22) PCT Filed: Jan. 29, 2002

(86) PCT No.: PCT/DE02/00312

§ 371 (c)(1),
(2), (4) Date: Aug. 11, 2003

(87) PCT Pub. No.: WO02/065557

PCT Pub. Date: Aug. 22, 2002

(65) Prior Publication Data

US 2004/0219460 A1    Nov. 4, 2004

(30) Foreign Application Priority Data

Feb. 9, 2001    (DE) ................. 101 05 914

(51) Int. Cl.
*H01L 35/24* (2006.01)
*H01L 51/00* (2006.01)
*H01L 29/76* (2006.01)
*H01L 29/94* (2006.01)
*H01L 21/31* (2006.01)

(52) U.S. Cl. .............. 257/40; 257/410; 438/82; 438/99; 438/780

(58) Field of Classification Search .......... 257/40, 257/410, 411; 438/82, 99, 780
See application file for complete search history.

(56) References Cited

U.S. PATENT DOCUMENTS 3,512,052 A    5/1970    MacIver et al.

(Continued)

FOREIGN PATENT DOCUMENTS

DE    33 38 597    5/1985

(Continued)

OTHER PUBLICATIONS

De Leeuw D M et al. : "Polymeric integrated circuits and light-emitting diodes", Electron Devices Meeting, 1997. Technical Digest., International Washington, DC, USA Dec. 7-10, 1997, New York, NY, USA IEEE, US, Dec. 7, 1997, pp. 331-336, XP010265518 ISBN: 0-7803-4100-7, the whole document.

(Continued)

*Primary Examiner*—Shouxiang Hu
(74) *Attorney, Agent, or Firm*—Carella Byrne et al.; Elliot M. Olstein; William Squire

(57) ABSTRACT

The invention relates to an organic field effect transistor which is especially characterized by a cross-linked, structured insulating layer (4) on which the gate electrode (5) is arranged. The structure of the OFET ensures that the gate electrode (5) of an OFET can be used as a strip conductor to the source electrode (2) of the next transistor and can be used in the construction of larger circuits.

20 Claims, 3 Drawing Sheets

U.S. PATENT DOCUMENTS

| | | |
|---|---|---|
| 3,769,096 A | 10/1973 | Ashkin |
| 3,955,098 A | 5/1976 | Kawamoto |
| 4,246,298 A * | 1/1981 | Guarnery et al. ........... 427/493 |
| 4,302,648 A | 11/1981 | Sado et al. |
| 4,340,657 A | 7/1982 | Rowe |
| 4,442,019 A | 4/1984 | Marks |
| 4,554,229 A * | 11/1985 | Small, Jr. .................... 430/17 |
| 4,865,197 A | 9/1989 | Craig |
| 4,926,052 A | 5/1990 | Hatayama |
| 4,937,119 A | 6/1990 | Nikles et al. |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takahira |
| 5,347,144 A | 9/1994 | Garnier et al. |
| 5,364,735 A | 11/1994 | Akamatsu et al. |
| 5,395,504 A | 3/1995 | Hoffman et al. |
| 5,480,839 A | 1/1996 | Ezawa et al. |
| 5,486,851 A | 1/1996 | Gehner et al. |
| 5,502,396 A | 3/1996 | Desarzens |
| 5,546,889 A | 8/1996 | Wakita et al. |
| 5,569,879 A | 10/1996 | Gloton et al. |
| 5,574,291 A | 11/1996 | Dodabalapur et al. |
| 5,578,513 A | 11/1996 | Maegawa |
| 5,580,794 A | 12/1996 | Allen |
| 5,625,199 A | 4/1997 | Baumbach et al. |
| 5,630,986 A | 5/1997 | Miller |
| 5,652,645 A | 7/1997 | Jain |
| 5,691,089 A | 11/1997 | Smayling |
| 5,705,826 A | 1/1998 | Aratani et al. |
| 5,729,428 A | 3/1998 | Sakata et al. |
| 5,854,139 A | 12/1998 | Kondo et al. |
| 5,869,972 A | 2/1999 | Birch et al. |
| 5,883,397 A | 3/1999 | Isoda et al. |
| 5,892,244 A | 4/1999 | Tanaka et al. |
| 5,967,048 A | 10/1999 | Fromson et al. |
| 5,970,318 A | 10/1999 | Choi et al. |
| 5,973,598 A | 10/1999 | Beigel |
| 5,994,773 A | 11/1999 | Hirakawa |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,072,716 A | 6/2000 | Jacobsen et al. |
| 6,083,104 A | 7/2000 | Fung |
| 6,087,196 A | 7/2000 | Sturm et al. |
| 6,133,835 A | 10/2000 | De Leeuw et al. |
| 6,150,668 A | 11/2000 | Bao et al. |
| 6,180,956 B1 * | 1/2001 | Chondroudis et al. ........ 257/40 |
| 6,197,663 B1 | 3/2001 | Chandross et al. |
| 6,207,472 B1 | 3/2001 | Calligari et al. |
| 6,215,130 B1 | 4/2001 | Dodabalapur |
| 6,221,553 B1 | 4/2001 | Wolk et al. |
| 6,251,513 B1 | 6/2001 | Hyatt et al. |
| 6,284,562 B1 | 9/2001 | Batlogg et al. |
| 6,300,141 B1 | 10/2001 | Segal et al. |
| 6,321,571 B1 | 11/2001 | Themont et al. |
| 6,322,736 B1 | 11/2001 | Bao et al. |
| 6,329,226 B1 | 12/2001 | Jones et al. |
| 6,330,464 B1 | 12/2001 | Colvin et al. |
| 6,335,539 B1 | 1/2002 | Dimitrakopoulos et al. |
| 6,340,822 B1 | 1/2002 | Brown et al. |
| 6,344,662 B1 | 2/2002 | Dimitrakopoulos et al. |
| 6,362,509 B1 | 3/2002 | Hart |
| 6,384,804 B1 | 5/2002 | Dodabalapur et al. |
| 6,403,396 B1 | 6/2002 | Gudesen et al. |
| 6,429,450 B1 | 8/2002 | DeLeeuw et al. |
| 6,498,114 B1 | 12/2002 | Amundson et al. |
| 6,517,995 B1 | 2/2003 | Jacobson et al. |
| 6,555,840 B1 | 4/2003 | Hudson et al. |
| 6,593,690 B1 | 7/2003 | McCormick et al. |
| 6,603,139 B1 | 8/2003 | Tessler et al. |
| 6,621,098 B1 | 9/2003 | Jackson et al. |
| 6,852,583 B2 | 2/2005 | Bernds et al. |
| 2002/0002284 A1 | 1/2002 | Heeger et al. |
| 2002/0018911 A1 | 2/2002 | Bernius et al. |
| 2002/0022284 A1 | 2/2002 | Heeger et al. |
| 2002/0025391 A1 | 2/2002 | Angelopoulos et al. |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Stiene |
| 2002/0170897 A1 | 11/2002 | Hall |
| 2002/0195644 A1 | 12/2002 | Dodabalapur et al. |
| 2003/0059987 A1 | 3/2003 | Henning et al. |
| 2003/0112576 A1 | 6/2003 | Brewer et al. |
| 2003/0175427 A1 | 9/2003 | Loo et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0084670 A1 | 5/2004 | Tripsas et al. |
| 2004/0211329 A1 | 10/2004 | Funhata et al. |

FOREIGN PATENT DOCUMENTS

| | | |
|---|---|---|
| DE | 4243832 | 6/1994 |
| DE | 198 52312 | 5/1999 |
| DE | 198 16 860 | 11/1999 |
| DE | 19918193 | 11/1999 |
| DE | 198 51703 | 5/2000 |
| DE | 100 06 257 | 9/2000 |
| DE | 199 21024 | 11/2000 |
| DE | 19933757 | 1/2001 |
| DE | 69519782 | 1/2001 |
| DE | 199 35 527 | 2/2001 |
| DE | 199 37 262 | 3/2001 |
| DE | 100 12204 | 9/2001 |
| DE | 10033112 | 1/2002 |
| DE | 100 45 192 | 4/2002 |
| DE | 100 47 171 | 4/2002 |
| DE | 100 43204 | 4/2002 |
| DE | 100 58 559 | 5/2002 |
| DE | 10061297 | 6/2002 |
| DE | 101 17 663 A1 | 10/2002 |
| DE | 101 20 687 | 10/2002 |
| DE | 102 19905 | 12/2003 |
| EP | 0 108650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418504 | 3/1991 |
| EP | 0 442123 | 8/1991 |
| EP | 0460242 | 12/1991 |
| EP | 0501456 A3 | 9/1992 |
| EP | 0501456 A3 | 9/1992 |
| EP | 0 511807 | 11/1992 |
| EP | 0 528662 | 2/1993 |
| EP | 0685985 | 12/1995 |
| EP | 0716458 | 6/1996 |
| EP | 0 785 578 A2 | 7/1997 |
| EP | 0 785 578 A3 | 7/1997 |
| EP | 0 786820 | 7/1997 |
| EP | 0 615 256 B1 | 9/1998 |
| EP | 0962984 | 12/1999 |
| EP | 0966182 | 12/1999 |
| EP | 0 979715 | 2/2000 |
| EP | 0981165 | 2/2000 |
| EP | 0981165 A1 | 2/2000 |
| EP | 0989614 A2 | 3/2000 |
| EP | 1 048 912 | 11/2000 |
| EP | 1 052 594 | 11/2000 |
| EP | 1065725 A2 | 1/2001 |
| EP | 1065725 A3 | 1/2001 |

| | | | |
|---|---|---|---|
| EP | 1 083 775 A1 | 3/2001 | |
| EP | 1 102 335 A2 | 5/2001 | |
| EP | 1 104 035 A2 | 5/2001 | |
| EP | 1 103916 | 5/2001 | |
| EP | 1 134 694 | 9/2001 | |
| EP | 1224999 | 7/2002 | |
| EP | 1237207 | 9/2002 | |
| EP | 1 318 084 | 6/2003 | |
| FR | 2793089 | 11/2000 | |
| GB | 723598 | 2/1955 | |
| GB | 2 058 462 | 4/1981 | |
| JP | 54069392 | 6/1979 | |
| JP | 61167854 | 7/1986 | |
| JP | 362065477 A | 3/1987 | |
| JP | 05152560 | 6/1993 | |
| JP | 05259434 | 10/1993 | |
| JP | 05347422 | 12/1993 | |
| JP | 08197788 | 8/1996 | |
| JP | 09083040 | 3/1997 | |
| JP | 09320760 | 12/1997 | |
| JP | 09320760 A | 12/1997 | |
| JP | 10026934 | 1/1998 | |
| JP | 2969184 B | 11/1999 | |
| JP | 2001085272 | 3/2001 | |
| WO | WO 93 16491 | 8/1993 | |
| WO | WO 94/17556 | 8/1994 | |
| WO | WO 95/06240 | 3/1995 | |
| WO | WO 95/31831 | 11/1995 | |
| WO | WO 95 31831 A | 11/1995 | |
| WO | WO 96 02924 A1 | 2/1996 | |
| WO | WO 96/19792 | 6/1996 | |
| WO | WO 97/12349 | 4/1997 | |
| WO | WO 97/18944 | 5/1997 | |
| WO | WO 9718944 | 5/1997 | |
| WO | WO 98 18186 | 4/1998 | |
| WO | WO 9818156 | 4/1998 | |
| WO | WO 98/40930 | 9/1998 | |
| WO | WO 99/07189 | 2/1999 | |
| WO | WO 99/10929 | 3/1999 | |
| WO | WO 99 10939 | 3/1999 | |
| WO | WO 99 21233 | 4/1999 | |
| WO | WO 99 30432 | 6/1999 | |
| WO | WO 99 39373 | 8/1999 | |
| WO | WO 99 40631 | 8/1999 | |
| WO | WO 99/53371 | 10/1999 | |
| WO | WO 99 54936 | 10/1999 | |
| WO | WO 9954936 | 10/1999 | |
| WO | WO 99/66540 | 12/1999 | |
| WO | WO 00/33063 | 6/2000 | |
| WO | WO 00/36666 | 6/2000 | |
| WO | WO 01/03126 | 1/2001 | |
| WO | WO 01/06442 | 1/2001 | |
| WO | WO 01 08241 | 2/2001 | |
| WO | WO 01 15233 | 3/2001 | |
| WO | WO 01/15233 | 3/2001 | |
| WO | WO 01/17029 | 3/2001 | |
| WO | WO 01/17041 | 3/2001 | |
| WO | WO 01/27998 | 4/2001 | |
| WO | WO 01/46987 | 6/2001 | |
| WO | WO 01 47044 A2 | 6/2001 | |
| WO | WO 01 47045 | 6/2001 | |
| WO | WO 0173109 A2 | 10/2001 | |
| WO | WO 0173109 A3 | 10/2001 | |
| WO | WO 02/05360 A1 | 1/2002 | |
| WO | WO 0205361 | 1/2002 | |
| WO | WO 02/15264 | 2/2002 | |
| WO | WO 02 19443 | 3/2002 | |
| WO | WO 0219443 | 3/2002 | |
| WO | WO 02/29912 | 4/2002 | |
| WO | WO 02/43071 | 5/2002 | |
| WO | WO 02/47183 | 6/2002 | |
| WO | WO 0247183 | 6/2002 | |
| WO | WO 02/065557 | 8/2002 | |
| WO | WO02065557 A1 | 8/2002 | |
| WO | WO 02/071139 | 9/2002 | |
| WO | WO 02/071505 | 9/2002 | |
| WO | WO 02/076924 | 10/2002 | |
| WO | WO 02/091495 | 11/2002 | |
| WO | WO 02 095805 A3 | 11/2002 | |
| WO | WO 02095805 A2 | 11/2002 | |
| WO | WO 02/099908 | 12/2002 | |
| WO | WO 0299907 | 12/2002 | |
| WO | WO 03/046922 | 6/2003 | |
| WO | WO 03/069552 | 8/2003 | |
| WO | WO 03067680 | 8/2003 | |
| WO | WO 03/081671 | 10/2003 | |
| WO | WO 03/095175 | 11/2003 | |
| WO | WO 2004/032257 | 4/2004 | |
| WO | WO 2004/042837 | 5/2004 | |
| WO | WO2004042837 | 5/2004 | |
| WO | WO 2004047144 A2 | 6/2004 | |
| WO | WO 2004047144 A3 | 6/2004 | |
| WO | WO 2004047194 A2 | 6/2004 | |
| WO | WO 2004047194 A3 | 6/2004 | |
| WO | WO 2004/083859 | 9/2004 | |
| WO | WO 00 79617 | 12/2004 | |

OTHER PUBLICATIONS

Lowe J et al. :, "POLY (3-(2-Acetoxyethyl)Thiophene): A Model Polymer for Acid-Catalyzed Lithography" Synthetic Metals, Elsevier Sequoia, Lausanne, CH, vol. 85, 1997, pp. 1427-1430, XP000826731, ISSN: 0379-6779, the whole document.

Schrodner M et al.: "Plastic electronics based on semiconducting polymers" First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in MICR, pp. 91-94, XP001077730, 2001, Piscataway, NJ, USA, IEEE, USA, ISBN: 0-7803-7220-4, the whole document.

U.S. Appl. No. 10/362,932, Organic Field Effect Transistor, Method for Structuring an OFET and Integrated Circuit, Adolf Bernds et al.

U.S. Appl. No. 10/380,113, Organic Rectifier, Circuit, RFID Tag and Use of an Organic Rectifier, Adolf Bernds et al.

U.S. Appl. No. 10/380,206, Organic Memory, Identification Marker (RFID-TAG) with Organic Memory and Uses of an Organic Memory, Adolf Bernds et al.

U.S. Appl. No. 10/381,032, Electrode and/or Conductor Track for Organic Components and Production Method Thereof, Adolf Bernds et al.

U.S. Appl. No. 10/433,959, Organic Field Effect Transistor, Method For Structuring an OFET and Integrated Circuit, Adolf Bernds.

U.S. Appl. No. 10/433,961, Device For Detecting and/or Transmitting at Least One Environmental Influence, Method for Producing Said Device and Use Thereof, Wolfgang Clemens et al.

U.S. Appl. No. 10/467,636, Organic Field Effect Transistor With a Photostructured Gate Dielectric, Method for the Production and Use Thereof in Organic Electronics, Adolf Bernds et al.

U.S. Appl. No. 10/473,050, Device WIth At Least Two Organic Electronic Components and Method for Producing the Same, Adolf Bernds et al.

U.S. Appl. No. 10/479,234, Organic Field Effect Transistor, Method for Production and Use Thereof in the Assembly of Integrated Circuits, Adolf Bernds et al.

U.S. Appl. No. 10/479,238, Method For Producing Conductive Structures by Means of Printing Technique, and Active Components Produced Therefrom For Integrated Circuits, Adolf Bernds et al.

U.S. Appl. No. 10/492,922, Insulator for An Organic Electronic Component, Erwann Guillett et al.

U.S. Appl. No. 10/492,923, Electronic Unit, Circuit Design for the Same and Production Method, Wolfgang Clemens et al.

U.S. Appl. No. 10/498,610, Organic Field Effect Transistor with Offset Threshold Voltage and the Use Thereof, Walter Fix et al.

Logic Component Comprising Organic Field Effect Transistors, Walter Fix et al.

Device and Method for Laser Structuring Functional Polymers and, Adolf Bernds et al.

Garnier F et al:, "Vertical Devices Architecture By Molding Of Organic-Based Thin Film Transistor", Applied Physics Letters, American Institute Of Physics. XP000784120, issn: 0003-6951 abbildung 2.

Collet J. et al:, Low Voltage, 30 NM Channel Length, Organic Transistors With a Self-Assembled Monolayer as Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.

Hwang J D et al:, "A Vertical Submicron Slc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

"Short-Channel Field-Effect Transistor", IBM Technical Disclosure Bulletin, IBM Corp., New York, US, Bd. 32, Nr. 3A, Aug. 1, 1989, Seiten 77-78, XP000049357, ISSN:0018-8689, das ganze Dokument.

Redecker, M. et al., "Mobility enhancement through homogeneous nematic alignment of a liquid-crystalline polyfluorene", 1999 American Institute of Physics Letters, vol. 74, No. 10, pp. 1400-1402.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Miyamoto, Shoichi et al:, Effect of LDD Structure and Channel Poly-Si Thinning on a Gate-All-Around TFT (GAT) for SRAM's , IEEE Transactions on Electron Devices. vol. 46, No. 8, Aug. 1999.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Zangara L: "Metall Statt Halbleiter, Programmierung Von Embedded ROMS Ueber Die Metallisierungen", Elektronik, Franzis Verlag GMBH, Munchen, DE, Bd. 47, Nr. 16, Aug. 4, 1998, Seiten 52-55, XP000847917, ISSN: 0013-5658, Seite 52, rechtes Plate, Zeile 7-Seite 53, Iinke Spalte, Zelle 14; Abbildungen 1, 2.

Hergel, H. J.: "Pld-Programmiertechnologien", Elektronik, Franzis Verlag GMBH. Munchen, DE, Bd 41, Nr. 5, Mar. 3, 2003, Seiten 44-46, XP000293121, ISSN: 0013-5658, Abbildungen 1-3.

Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, Iinke Spalte, Zeile 24; Abbildung 5.

Patent Abstracts of Japan, vol. 9, No. 274 (E-354), 31 Oktober 1985 (1985-10-31) & JP 60 117769 (A Fujitsu KK), Jun. 25, 1985 Zusammenfassung.

Zie Voor Titel Boek, de 2e PAGINA, XP-002189001, PG 196-228.

Drury et al., "Low-Cost All-Polymer Intergrated Circuits", American Institute of Physics, Applied Physics Letters, 1998, vol. 73, No. 1, pp. 108-110, Jul. 6, 1998.

Kuhlmann et al., "Terabytes in Plastikfolie", Organische Massenspeicher vor der Serienproduktion.

Garnier, F. et al, "All-Polymer Field-Effect Transistor Realized by Printing Techniques", Science, American Association for the Advancement of Science, US, vol. 265, Sep. 16, 1994, pp. 1684-1686.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricated by Printing Techniques", Chem. Mater vol. 9, No. 6, 1997, pp. 1299-1301.

Drury, C. J. et al., "Low-cost all-polymer integrated circuits", Applied Physics Letters, vol. 73, No. 1, Jul. 6, 1988, pp. 108-110.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Patterns in Polybutadiene Films:, Macromolecules, vol. 29, No. 1, 1996, pp. 282-287, XP 001042019, the whole document.

Roman et al., Polymer Diodes With High Rectification:, Applied Physics Letters, vol. 75, No. 21, Nov. 22, 1999.

Patent Abstracts of Japan, vol. 10, No. 137, May 21, 1986 (JP 361001060A).

Schoebel, "Frequency Conversion with Organic-On-Inorganic Heterostructured Diodes", Extended Abstracts of the International Conference on Solid State Devices and Materials, Sep. 1, 1997.

Braun., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Murray Hill, NJ, Nov. 20, 2000. XP-002209726.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Garnier et al., "Conjugated Polymers and Oligomers as Active Material For Electronic Devices", Synthetic Metals, vol. 28, 1989.

Gelnick, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, V. 82, 1996, pp. 141-148.

Kobel W. et al., "Generation of Micropatterns in Poly (3-Methyl-Thiopene) Films Using Microlithography: A First Step in the Design of an All-Organic Thin-Film Transistor" Synthetic Metals, V. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastic Circuits," Proc. of SPIE, v. 466, 2001, p. 95-102.

Clemens, W. et al., "Vom Organischen Transistor Zum Plastik-Chip," Physik Journal, V. 2, 2003, pp. 31-36.

Crone, B. et al, "Large-scale complementary Integrated circuits based on Organic transistors", Nature, vol. 403, Feb. 3, 2000, pp. 521.

Fix, W., et al., "Fast polymer integrated circuits", American Institute of Physics, Applied Physics Letters, vol. 81, No. 89, Aug. 2002, pp. 1735-1737.

Dodabalapur, A. et al., Organic smart pixels, American Institute of Physics, Applied Physics Letters, vol. 73, No. 2, Jul. 13, 1998, pp. 142-144.

Halls, J.J. M., et al., "Efficient photodiodes from Interpenetrating polymer networks", Nature, vol. 376, Aug. 10, 1995, pp. 498-500.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transitor Circuits", IEEE Electron Device Letters, vol. 20, No. 6, pp. 289-291.

Bao, Z. et al., "Organic and Polymeric Materials for the Fabrications of Thin Film Field-Effect Transistors", paper presented at the meeting of American Chemical Society, Division of Polymer Chemistry, XX, XX, Bd. 39, Nr. 1, Mar. 29, 1998, P001032497, ISSN: 0032-3934 das ganze Dokument.

Patent Abstracts of Japan, vol. 013, No. 444 (E-828), Oct. 5, 1989 & JP 01 169942 A (Hitachi Ltd), Jul. 5, 1989.

Oelkrug, D. et al., "Electronic spectra of self-organized oligothiophene films with 'standing' and 'lying' molecular units", Elsevier Science S.A., 1996, Thin Solid Films 284-270.

Sandberg, H. et al, "Ultra-thin Organic Films for Field Effect Transistors", SPIE vol. 4466, 2001, pp. 35-43.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

De Leeuw D.M. et al., "Polymeric Integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Lowe, J. et al.,"Poly (3-(2-Acetoxyethyl)Thiopene): A Model Polymer for Acid-Catalyzed Lithography", Synthetic Metals, Elsevier Sequoia, Lausanne, CH, Bd. 85, 1997, Seiten 1427-1430.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94.

U.S. Appl. No. 10/344,951, Adolf Bernds et al.
U.S. Appl. No. 10/362,932, filed Oct. 2, 2003, Adolf Bernds et al.
U.S. Appl. No. 10/380,113, filed Sep. 25, 2003, Adolf Bernds et al.
U.S. Appl. No. 10/380,206, Adolf Bernds et al.
U.S. Appl. No. 10/381,032, Adolf Bernds et al.
U.S. Appl. No. 10/433,959, Adolf Bernds.
U.S. Appl. No. 10/433,961, Wolfgang Clemens et al.
U.S. Appl. No. 10/451,108, Mark Giles et al.
U.S. Appl. No. 10/467,636, Adolf Bernds et al.
U.S. Appl. No. 10/473,050, Adolf Bernds et al.
U.S. Appl. No. 10/479,234, filed Dec. 30, 2004, Adolf Bernds et al.
U.S. Appl. No. 10/479,238, Adolf Bernds et al.
U.S. Appl. No. 10/492,922, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/524,646, Walter Fix et al.

Fraunhofer Magazin, Nr, 4, 2001, Seiten 8-13, XP002257822, Polytronic: Chips von der Rolle, das ganze Dokument.

U.S. Appl. No. 10/533,756, Wolfgang Clemens et al.
U.S. Appl. No. 10/534,678, Wolfgang Clemens et al.
U.S. Appl. No. 10/535,448, Wolfgang Clemens et al.
U.S. Appl. No. 10/535,449, Adolf Bernds et al.
U.S. Appl. No. 10/344,926, Wolfgang Clemens et al.

Harsanyi G. et al, "Polytronics for biotronics:unique possibilities of polymers in biosensors and BioMEMS", IEEE Polytronic 2002 Conference, Jun. 23, 2002, pp. 211-215.

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.

Gosain, D.P., "Excimer taser crystallized poly-Si TFT's on plastic substrates", Second International Symposium on Laser Precision Microfabrication, May 16-18, 2001, Singapore, vol. 4426, pp. 394-400.

Lu, Wen et al., "Use of Ionic Liquids for π-Conjugated Polymer Electrochemical Devices", Science, vol. 297, 2002, pp. 983-987/.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International, Melbourne, 1992, pp. 249-253.

Velu, G. et al. "Low Driving Voltages and Memory Effect in Organic Thin-Film Transistors With A Ferroelectric Gate Insulator", Applied Physics Letters, American Institute of Physics, New York, Vo.I 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

U.S. Appl. No. 10/535,448, W. Clemens et al.
U.S. Appl. No. 10/535,449, Walter Fix et al.
U.S. Appl. No. 10/344,926, filed Feb. 12, 2004, Adolf Bernds et al.
U.S. Appl. No. 10/541,815, Axel Gerlt et al.
U.S. Appl. No. 10/541,956, Wolfgang Clemens et al.
U.S. Appl. No. 10/541,957, Walter Fix et al.

Koezuka, H. et al., "Macromolecular Electronic Device", Mol. Cryst. Liq. Cryst. 1994, vol. 2555, pp. 221-230.

U.S. Appl. No. 10/543,561, Wolfgang Clemens et al.
U.S. Appl. No. 10/542,678, Adolf Bernds et al.
U.S. Appl. No. 10/542,679, Adolf Bernds et al.

Dai, L. et al., "Conjugation of Polydienes by Oxidants Than Iodine", Elsevier Science S.A., Synthetic Metals 86 (1997) 1893-1894.

Dai, L. et al., "$I_2$-Doping" of 1,4-Polydienes, Elsevier Science S.A., Synthetic Metals 69 (1995), pp. 563-566.

Qiao, X. et al., "The FeCl3-doped poly3-alkithiophenes) in solid state", Elsevier Science, Synthetic Metals 122 (2001) pp. 449-454.

* cited by examiner

ORGANIC FIELD EFFECT TRANSISTOR WITH A PHOTOSTRUCTURED GATE DIELECTRIC, METHOD FOR THE PRODUCTION AND USE THEREOF IN ORGANIC ELECTRONICS

CROSS REFERENCE TO RELATED APPLICATIONS

This is the 35 USC 371 national stage of international application PCT/DE02/00312 filed on Jan. 29, 2002, which designated the United States of America

FIELD OF THE INVENTION

The present invention relates to organic field effect transistors, so-called OFETs, with photopatterned gate dielectric as well as a method for the production thereof, and the use of said field effect transistors in organic electronics.

BACKGROUND OF THE INVENTION

Field effect transistors play a central role in all areas of electronics. In order to adapt them to suit particular applications, it has been necessary to make them lighter and more flexible. The development of semiconducting and conducting polymers has made it possible to produce organic field effect transistors, all parts of which, including the semiconductor layer as well as the source, drain and gate electrodes, are fabricated from polymeric materials.

However, in the production of organic field effect transistors a plurality of organic layers have to be patterned one on top of the other in order to obtain an OFET of normal construction, as shown in FIG. 1. This is possible only to a very limited extent using conventional photolithography which is actually used for patterning inorganic materials. The operations normally involved in photolithography dissolve or attack the organic layers and therefore make them unusable. This occurs, for example, when a photoresist is spun on, developed and stripped off.

This problem has been solved using an organic field effect transistor as described in Applied Physics Letters 1998, page 108 et seq. A polyaniline-coated polyimide film is used as the substrate. In this first polyaniline layer, the source and drain electrode are formed by irradiation through a first mask. In this first layer, a semiconductor layer of polythienylenevinylene (PTV) is also formed, on which polyvinylphenol is then crosslinked using hexamethoxymethylmelamine HMMM. This layer is used as the gate dielectric and as an insulator for the next layer and the interconnects. A further polyaniline layer is finally formed thereon in which the second layer of interconnects and the gate electrode is defined by patterning. The vertical interconnects are produced mechanically by punching pins through the layers.

The above method prevents previously applied layers from being dissolved or otherwise damaged. However, it has been shown that in particular the last operation for forming the vertical interconnects (otherwise known as vias) does not permit the fabrication of complex circuits.

Applied Physics Letters 2000, page 1487 describes how this problem can be solved by providing low-resistance vias in the field effect transistor structure by means of photopatterning of photoresist material. To this end, another design of OFET, namely a so-called "bottom gate" structure, is regarded as indispensable. If a "top gate" structure of the same composition were produced, this would result in unacceptable contact resistances in the order of M$\Omega$.

However, the construction and the operations for patterning this OFET with bottom gate structure are complex, making it impossible to manufacture particularly complex circuits economically.

SUMMARY OF THE INVENTION

The object of the present invention was therefore to specify an organic field effect transistor or a method for the manufacture thereof which permits the use of photolithography without attacking or dissolving the organic layers in all operations as well as making possible a construction which provides a simple means of vertical interconnection between conducting tracks at different levels in organic integrated circuits. The organic field effect transistors must at the same time be manufacturable cheaply and economically using simple operations.

The subject matter of the present invention is therefore an organic field effect transistor characterized in that, on a flexible substrate there are disposed, in a first layer, source and drain electrodes as well as a semiconductor on which, in a second layer, an insulator is pattern-formed and onto which, in a third layer, a gate electrode is deposited (top gate structure).

The organic field effect transistor according to the invention is light and extremely flexible, as it is only formed from organic layers which are mainly patterned by means of photolithography but without using photoresist. By means of the patterning of the insulator layer in particular, the gate electrode of the organic field effect transistor according to the invention can simultaneously be used as the conducting track to the source electrode of the next transistor.

Advantageous embodiments of the subject matter of the invention will emerge from the sub-claims 1 to 10.

Thus ultrathin glasses, but for cost reasons preferably plastic foils, can be used as the substrate. Polyethylene terephthalate and polyimide foils are particularly preferred. The substrate must in each case be as light and flexible as possible. As the thickness of the substrate determines the actual thickness of the device as a whole—all the other layers combined are only some 1000 nm thick—the substrate thickness must also be kept as small as possible, normally in the range of approximately 0.05 to 0.5 mm.

The source and drain electrodes can consist of wide variety of materials. The type of material will basically be determined by the type of fabrication preferred. Thus, for example, electrodes of indium tin oxide (ITO) can be produced by photolithography on ITO-coated substrates, the ITO being etched away from the areas not covered by photoresist. Polyaniline (PANI) electrodes can also be produced either by photopatterning or by photolithography on PANI-coated substrates. Equally, electrodes made of conductive polymers can be produced by printing the conductive polymer directly onto the substrate. Conductive polymers include, for example, doped polyethylene (PEDOT) or possibly PANI.

The semiconductor layer consists, for example, of conjugated polymers such as polythiophenes, polythienylenevinylenes or polyfluorene derivatives which are solution processable by spin-coating, silk-screening or printing. Also suitable for creating the semiconductor layer are so-called "small molecules", i.e. oligomeres such as sexithiophene or pentacene, which are evaporated onto the substrate by a vacuum technique.

However, an important aspect of the present subject matter of the invention is the way in which the insulator layer is created. This is a crosslinked insulator which is crosslinked and patterned by means of photolithography, i.e. under partial exposure. An insulator material is crosslinked area by area using a crosslinker under acid catalysis. Suitable insulator materials in the context of the present invention include poly(4-hydroxystyrene) or melamine-formaldehyde resins containing hydroxyl groups. The crosslinker is acid-sensitive, specifically hexamethoxymethylmelamine (HMMM). Acid catalysis is effected by means of a photoinitiator, e.g. diphenyliodonium tetrafluoroborate or triphenylsulfonium hexafluoroantimonate which produce an acid under the effect of light.

The present invention relates to a method for producing an organic field effect transistor wherein a flexible substrate is provided with a source and drain electrode as well as a semiconductor and is characterized in that an insulator is deposited on the semiconductor by applying an insulator material solution containing an acid-sensitive crosslinker as well as a photoinitiator, exposing it through a shadow mask covering the source and drain electrodes, and then baking it, crosslinking being effected at the exposed areas and the gate electrode being deposited on the thus crosslinked and patterned insulator.

BRIEF DESCRIPTION OF THE DRAWING

Details and preferred embodiments of the method according to the invention will emerge from the sub-claims 12 to 18. The invention will now be described in further detail with reference to FIGS. 1 to 3 and an exemplary embodiment.

In the accompanying drawings.

DETAILED DESCRIPTION OF THE INVENTION

Figure 1:
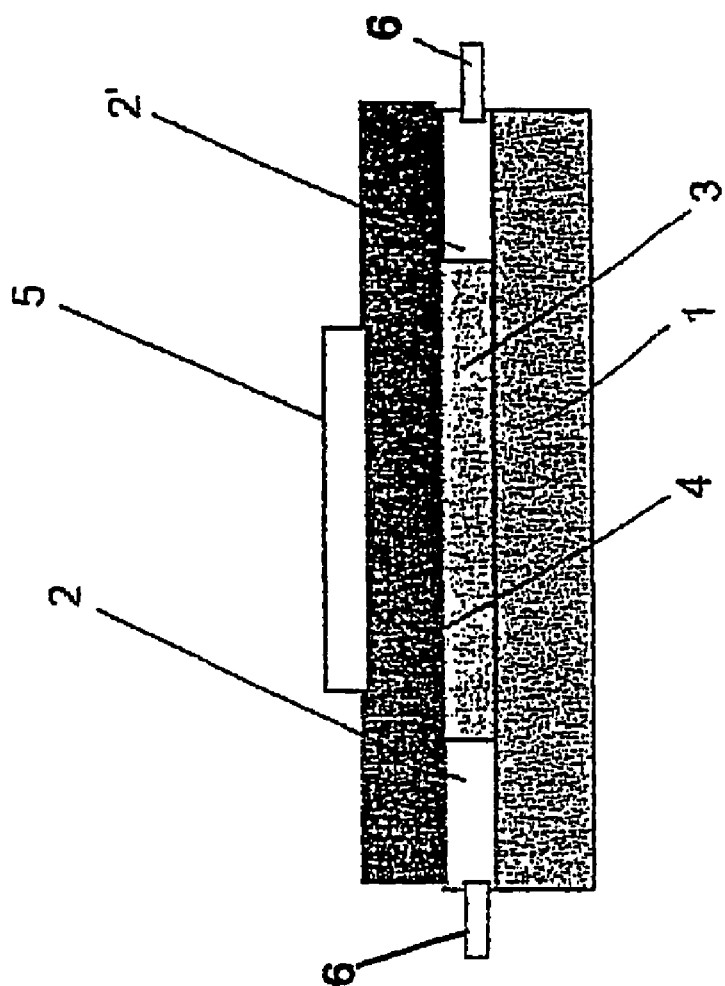
FIG. 1 shows the construction of a conventional OFET.

A conventional OFET consists of a substrate 1, source and drain electrodes 2 and 2', a semiconductor 3, an insulator 4 and the gate electrode 5. The conventional OFET requires contact tags 6 for combining individual OFETs to form larger circuits.

Figure 2:
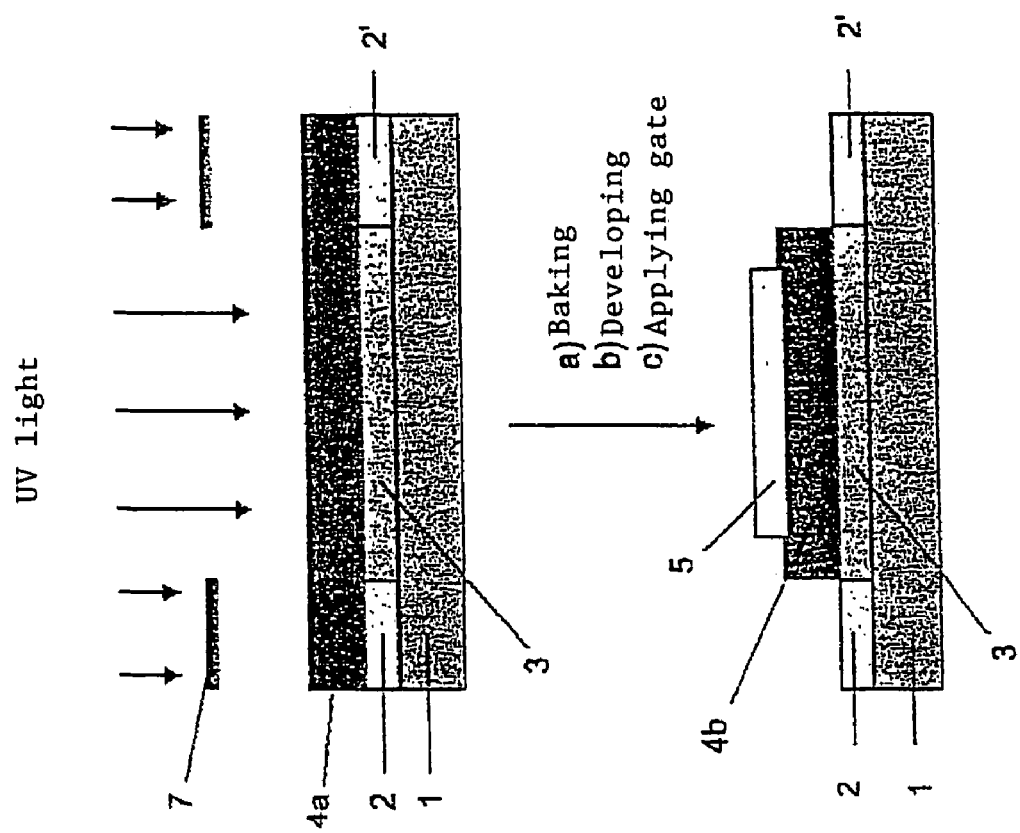
FIG. 2 shows the construction of an OFET according to the invention.
Figure 3:
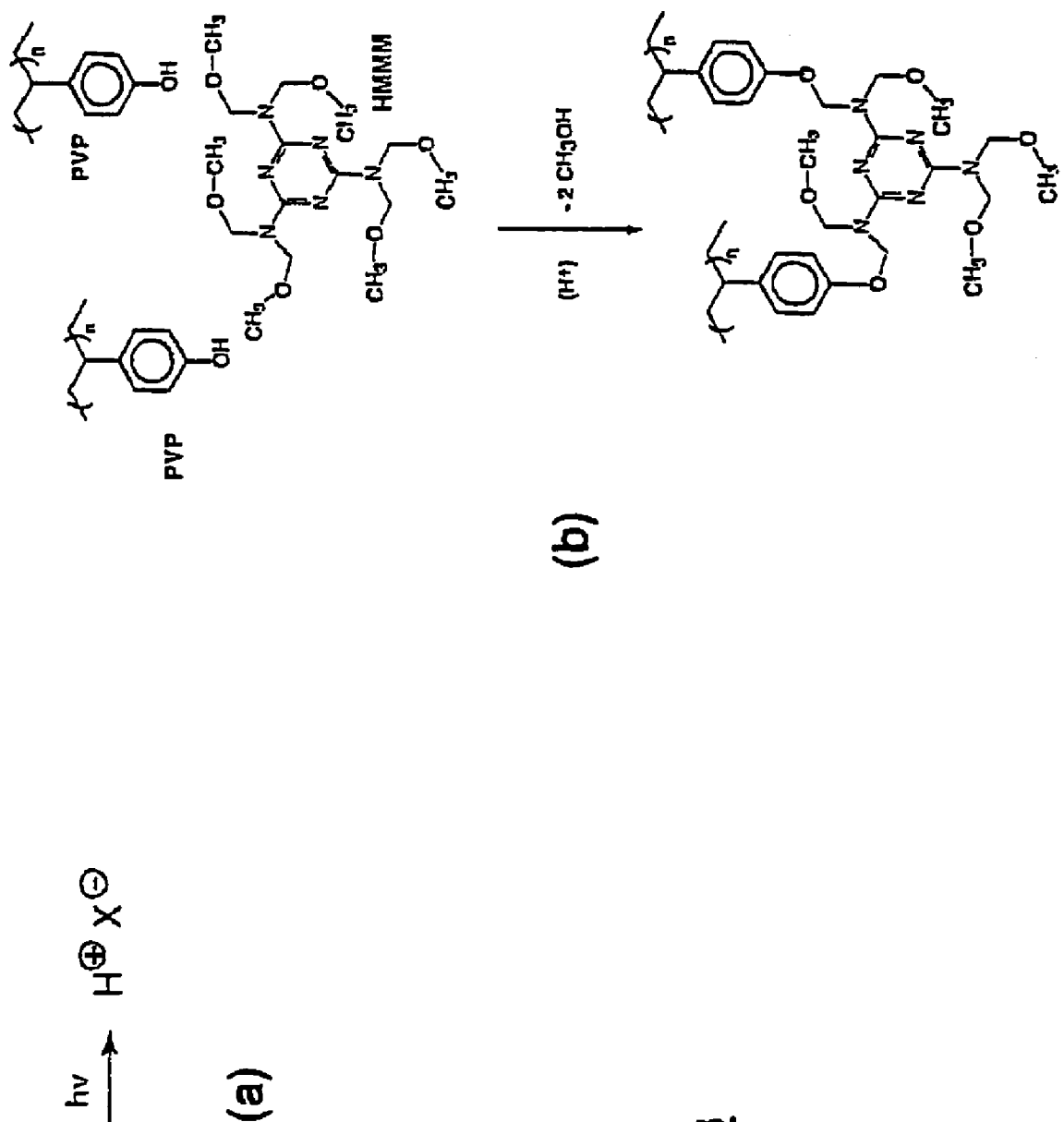
FIG. 3 shows chemical reactions underlying the production of the crosslinked, patterned insulator layer.

As shown in FIG. 2, the starting point for producing an OFET according to the invention is a similar structure to that of a conventional OFET. In other words, on a substrate 1 there are formed source and drain electrodes 2 and 2' as well as a semiconductor layer 3. The source and drain electrodes 2 and 2' as well as the semiconductor 3 are in one layer. On this layer a thin layer of an insulator material such as poly(4-hydroxystyrene) (PVP) or melamine-formaldehyde resins containing hydroxyl groups is deposited by spin-coating, screen printing or similar processes. The solution to be applied contains, in addition to the insulator material, an acid-sensitive crosslinker such as hexamethoxymethylmelamine (HMMM) and a photoinitiator such as diphenyliodonium tetrafluoroborate or triphenylsulfonium hexafluoroantimonate. This layer 4a is then exposed through a shadow mask 7, preferably with UV light. As a result of exposure, the photoinitiator produces an acid in accordance with reaction scheme (a) in FIG. 3 which effects the crosslinking between the insulator material and the crosslinker under the effect of temperature, i.e. in a subsequent baking operation (reaction scheme (b) in FIG. 3). Baking is performed at relatively low temperatures, approximately between 100° C. and 140° C., preferably at 120° C. This ensures that the unexposed areas remain uncrosslinked, as higher temperatures are required for crosslinking in the absence of a catalyst. In a final development step, the uncrosslinked insulator is removed by rinsing with a suitable solvent, such as n-butanol or dioxan. As shown in FIG. 2, a crosslinked and patterned insulator layer 4b on which the gate electrode is finally applied as described above is thereby produced directly on top of the semiconductor layer 3.

With the present method, the gate dielectric is therefore produced by photolithography without using photoresist. This results in an OFET whose gate electrode can be used simultaneously as the conducting track to the source electrode of the next transistor. This allows vertical interconnection between conducting tracks at different levels in organic integrated circuits.

An exemplary embodiment of this will now be disclosed, specifically indicating the reaction conditions.

EXEMPLARY EMBODIMENT FOR PRODUCING A GATE DIELECTRIC 5 ml of a 10% solution of poly(4-hydroxystene) in dioxan are mixed with 20 mg hexamethoxymethylmelamine and a catalytic trace of diphenyliodonium tetrafluoroborate and spin-coated onto a substrate already containing electrodes and semiconductor. The substrate is exposed through a shadow mask and then baked for 30 minutes at 120° C. After cooling, the insulator is removed at the unexposed and therefore uncrosslinked areas by intensive rinsing with or soaking in n-butanol. The gate electrode is formed thereon.

The OFETs according to the invention are ideally suitable for applications in the field of organic electronics and in particular for the production of identification stickers (ID tags), electronic watermarks, electronic barcodes, electronic toys, electronic tickets, for use in product or piracy protection or anti-theft security.

The invention claimed is:

1. Organic field effect transistor, comprising:
   a flexible substrate;
   a first layer on the substrate;
   source and drain electrodes and a semiconductor in the first layer;
   an insulator forming a second layer on the first layer, the insulator being pattern-formed and formed from an insulator material crosslinked with a crosslinker in the presence of a photoinitiator, the insulator pattern being produced by crosslinking the insulator in the desired pattern by photolithography with uncrosslinked insulator outside the pattern and then removing the uncrosslinked insulator material; and
   a gate electrode on the second layer forming a third layer.

2. Organic field effect transistor according to claim 1, wherein the substrate is an ultrathin glass foil or a plastic foil.

3. Organic field effect transistor according to claim 2, wherein the substrate is polyethylene terephthalate or a polyimide foil.

4. Organic field effect transistor according to claim 1, wherein the source and drain electrodes are formed from indium tin oxide (ITO), polyaniline (PANI) and/or conductive polymers.

5. Organic field effect transistor according to one of claim 1,
   wherein the semiconductor is formed from conjugated polymers or oligomers.

6. Organic field effect transistor according to claim 1, wherein the insulator material is selected from poly(4-hydroxystyrene) or from melamine-formaldehyde resins containing hydroxyl groups.

7. Organic field effect transistor according to claim 1, wherein the crosslinker is acid-sensitive, including hexamethoxymethylmelamine (HMMM).

8. Organic field effect transistor according to claim 1, wherein the photoinitiator is selected from diphenyliodonium tetrafluoroborate and triphenylsulfonium hexafluoroantimonate.

9. Organic field effect transistor according to claim 1, wherein the gate electrode is formed from polyaniline, other conductive polymers or carbon black.

10. Use of the organic field effect transistor according to claim 1 in organic electronics.

11. Use of the organic field effect transistor according to claim 1 for identification stickers (ID tags), electronic watermarks, electronic barcodes, electronic toys, electronic tickets, in product or piracy protection or anti-theft security.

12. Organic field effect transistor according to claim 1, wherein the insulator pattern is produced by patterning the insulator with photolithography without using a photoresist.

13. Method far producing an organic field effect transistor comprising:
providing a flexible substrate with a source and drain electrode and a semiconductor;
forming an insulator from an insulator material crosslinked with a crosslinker in the presence of a photoinitiator by applying an insulator material solution containing an acid-sensitive crosslinker and a photoinitiator to the semiconductor;
exposing the insulator through a shadow mask covering the source and drain electrodes;
patterning the insulator pattern by crosslinking the insulator in the desired pattern by photolithography with uncrosslinked insulator outside the pattern and then removing the uncrosslinked insulator material including baking to effect the crosslinking and patterning of the insulator at the exposed areas; and
depositing a gate electrode on the thus crosslinked and patterned insulator.

14. Method according to claim 13, wherein the insulator material is selected from poly(4-hydroxystyrene) or melamine-formaldehyde resins containing hydroxyl groups.

15. Method according to claim 13, wherein the crosslinker is acid-sensitive, including hexamethoxymethylmelamine (HMMM).

16. Method according to claim 15, wherein the photoinitiator produces an acid under the effect of light and is selected specifically from diphenyliodonium tetrafluoroborate and triphenylsulfonium hexafluoroantimonate.

17. Method according to claim 13, wherein the solution containing the insulator material, the crosslinker and the photoinitiator is applied by spin-coating or silk screen printing.

18. Method according to claim 13, wherein UV light used for exposure.

19. Method according to claim 13, wherein baking is performed at a temperature between 100° C. and 140° C.

20. Method according to claim 19, wherein baking is performed at a temperature of 12° C.

* * * * *

UNITED STATES PATENT AND TRADEMARK OFFICE
CERTIFICATE OF CORRECTION

PATENT NO.         : 7,238,961 B2                                    Page 1 of 1
APPLICATION NO.  : 10/467636
DATED              : July 3, 2007
INVENTOR(S)        : Adolf Bernds, Walter Fix and Henning Rost It is certified that error appears in the above-identified patent and that said Letters Patent is hereby corrected as shown below:

Col. 6, line 30,    change "12°C" to

-- 120°C --

Signed and Sealed this

Eighteenth Day of September, 2007

JON W. DUDAS
*Director of the United States Patent and Trademark Office*